(12) United States Patent
Seo et al.

(10) Patent No.: US 8,546,177 B2
(45) Date of Patent: Oct. 1, 2013

(54) METHODS OF MANUFACTURING PHASE-CHANGE MEMORY DEVICE AND SEMICONDUCTOR DEVICE

(75) Inventors: Hye Jin Seo, Ichon-si (KR); Keum Bum Lee, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 91 days.

(21) Appl. No.: 13/339,891

(22) Filed: Dec. 29, 2011

(65) Prior Publication Data

US 2013/0102120 A1    Apr. 25, 2013

(30) Foreign Application Priority Data

Oct. 20, 2011 (KR) .................. 10-2011-0107633

(51) Int. Cl.
*H01L 21/00* (2006.01)
(52) U.S. Cl.
USPC ............ 438/95; 438/210; 438/381; 438/947; 257/E21.004

(58) Field of Classification Search
USPC .................. 438/381, 382, 95, 210, 637, 947; 257/E21.004
See application file for complete search history.

(56) References Cited

U.S. PATENT DOCUMENTS

| 5,328,810 | A  | * | 7/1994 | Lowrey et al. | 430/313 |
| 8,106,519 | B2 | * | 1/2012 | Hong | 257/775 |
| 8,254,166 | B2 | * | 8/2012 | Klosterman et al. | 365/175 |
| 2006/0003565 | A1 | * | 1/2006 | Sasaki | 438/592 |
| 2009/0269927 | A1 | * | 10/2009 | Hong | 438/692 |

* cited by examiner

*Primary Examiner* — Michael Trinh
(74) *Attorney, Agent, or Firm* — IP & T Group LLP

(57) ABSTRACT

Methods of manufacturing a phase-change memory device and a semiconductor device are provided. The method of manufacturing the phase-change memory device includes forming a switching device layer, an ohmic contact layer, and a hard mask layer on a semiconductor substrate, patterning the hard mask layer to form a hard mask pattern, etching the ohmic layer and the switching layer using the hard mask pattern to form a pattern structure including an ohmic contact pattern, a switching device pattern, and the hard mask pattern, selectively oxidizing a surface of the pattern structure, forming an insulating layer to bury the pattern structure, and selectively removing the hard mask pattern other than the oxidized surface thereof to form a contact hole.

20 Claims, 6 Drawing Sheets

METHODS OF MANUFACTURING PHASE-CHANGE MEMORY DEVICE AND SEMICONDUCTOR DEVICE

CROSS-REFERENCES TO RELATED APPLICATION

The present application claims priority under 35 U.S.C. 119(a) to Korean patent application number 10-2011-0107633, filed on Oct. 20, 2011, in the Korean Patent Office, which is incorporated by reference in its entirety as if set forth herein in full.

BACKGROUND OF THE INVENTION

1. Technical Field

Exemplary embodiments of present invention relate to semiconductor fabrication technology, and more particularly, to a method of manufacturing a phase-change memory device having a hole and a method of manufacturing a semiconductor device.

2. Related Art

Next-generation semiconductor memory devices are to be provided with properties such as lower power consumption in addition to non-volatility of a general flash memory device, high speed operation of a static random access memory (SRAM), and high integration of dynamic RAM (DRAM). Research has been conducted on the next-generation semiconductor memory devices such as ferroelectric RAMs (FRAMs), magnetic RAMs (MRAMs), phase-change RAMs (PCRAMs), and nano floating gate memories (NFGMs) with lower power consumption and better characteristics of retention and read/write of data as compared with the general memory device. Among the next-generation semiconductor memory devices, since the PCRAM (hereinafter, referred to as phase-change memory device) has a simple structure and may be fabricated at a lower cost to operate at high speed, the phase-change memory device has been actively researched/developed as the next-generation semiconductor memory devices.

One of important issues in the phase-change memory device is to reduce a reset current for phase-change. To reduce the reset current, an area of a heating electrode may be smaller.

However, as the integration density of the semiconductor memory devices is increased, photolithography technology reaches the limit in forming a pattern and a hole. Thus, it is difficult to form an ultrafine lower electrode contact for obtaining the reset current at a desired amount.

A spacer may be formed on a sidewall of a contact hole to form a fine contact hole, but an upper sidewall of a contact hole may be removed in such a forming process including an anisotropic etching process. As a result, an area of an upper portion of a contact hole is extended.

SUMMARY

According to one aspect of an exemplary embodiment, a method of manufacturing a phase-change memory device is provided. The method includes forming a switching device layer, an ohmic contact layer, and a hard mask layer on a semiconductor substrate, patterning the hard mask layer to form a hard mask pattern, etching the ohmic contact layer and the switching device layer using the hard mask pattern to form a pattern structure including an ohmic contact pattern, a switching device pattern, and the hard mask pattern, selectively oxidizing a surface of the pattern structure, forming an insulating layer to bury the pattern structure, and selectively removing the hard mask pattern other than the oxidized surface thereof to form a contact hole.

According to another aspect of an exemplary embodiment, a method of manufacturing a phase-change memory device is provided. The method includes forming a pattern structure on a semiconductor substrate, wherein the pattern structure includes a metal pattern, a switching device pattern, an ohmic contact pattern, and a hard mask pattern, selectively oxidizing the hard mask pattern by a set thickness, forming a spacer on a sidewall of the pattern structure, forming and planarizing an insulating layer to bury the pattern structure, selectively removing the hard mask pattern other than oxidized portion thereof to form a contact hole, forming a heating electrode within the contact hole, and forming a phase-change material layer to be electrically connected to the heating electrode.

According to still another aspect of an exemplary embodiment, a method of manufacturing a semiconductor memory device is provided. The method includes forming a base layer on a semiconductor substrate. Silicon nitride layer patterns having a linewidth determined by an exposure limit may be formed on the base layer. A surface of each of the silicon nitride layer patterns may be oxidized to form a silicon oxynitride layer having a set thickness on a surface of each of oxidized silicon nitride layer patterns. Subsequently, an insulating layer may be filled between the oxidized silicon nitride layer patterns and then planarized to expose an upper surface of the oxidized silicon nitride layer pattern, and the oxidized silicon nitride layer patterns may be removed to form a contact hole.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
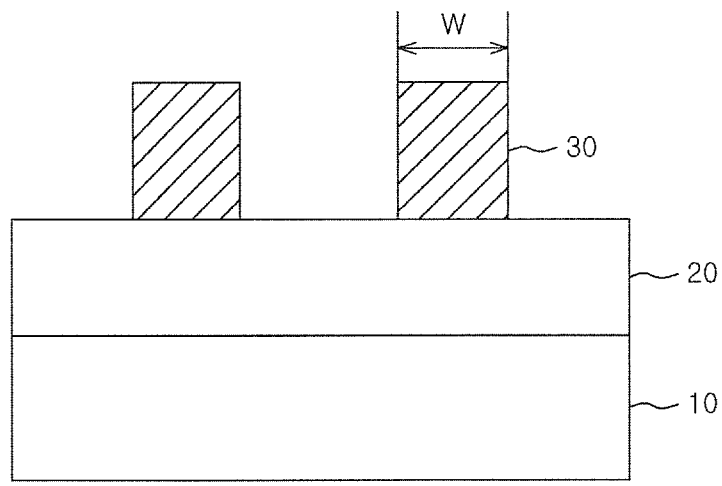
FIGS. 1 to 4 are cross-sectional views for processes illustrating a method of manufacturing a semiconductor device according to an exemplary embodiment of the present invention.

Hereinafter, exemplary embodiments will be described in greater detail with reference to the accompanying drawings.

Exemplary embodiments are described herein with reference to cross-sectional vies of exemplary embodiments (and intermediate structures). However, proportions and shapes illustrated in the drawings are exemplary only and may vary depending on various manufacturing techniques and/or design considerations. In parts of the drawings, lengths and sizes of layers and regions of exemplary embodiments may be exaggerated for clarity in illustration. Throughout the drawings, like reference numerals denote like elements. Throughout the disclosure, when a layer is referred to as being "on" another layer or substrate, it can be directly on the other layer or substrate, or intervening layers may also be present.

FIGS. 1 to 4 are cross-sectional views for processes illustrating a method of manufacturing a semiconductor device according to an exemplary embodiment of the preset invention.

Referring to FIG. 1, a base layer 20 is formed on a semiconductor substrate 10. The base layer 20 may be a layer in which a circuit pattern is formed. Hard mask patterns 30 are formed on the base layer 20. The hard mask pattern 30 may be formed using a general photolithography technique. For example, the hard mask pattern 30 has a linewidth W determined by an exposure limit of the photolithography process. As well-known, the hard mask pattern 30 is a material used as a mask in place of a photoresist pattern (not shown) to prevent scattered reflection from a layer to be etched, i.e. the base layer 20, or deformation of the photoresist pattern (not shown) in an etching process. Typically, a silicon nitride layer is used as the hard mask pattern 30, but the exemplary embodiment of the present invention is not limited to the silicon nitride layer. Any oxidizable material which may prevent deformation of a mask pattern in an etching process may be used.

Figure 2:
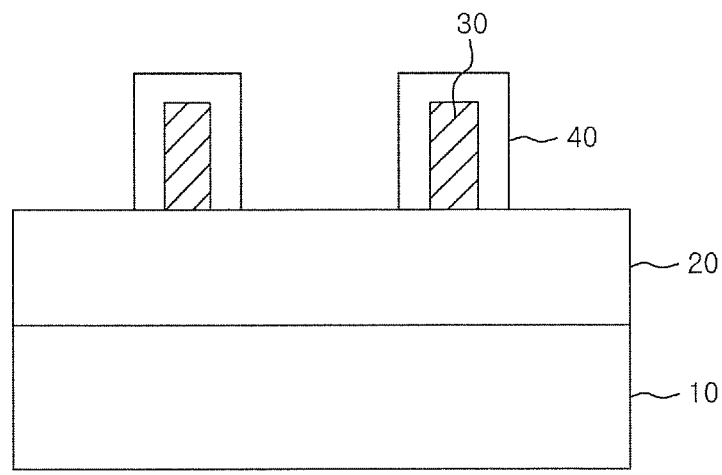

Referring to FIG. 2, a surface of the hard mask pattern 30 is oxidized by a set thickness. An oxidized thickness of the hard mask pattern 30 may depend on a linewidth of the remaining hard mask pattern 30. The reference numeral 40 denotes a surface-oxidized portion of the hard mask pattern 30.

Figure 3:
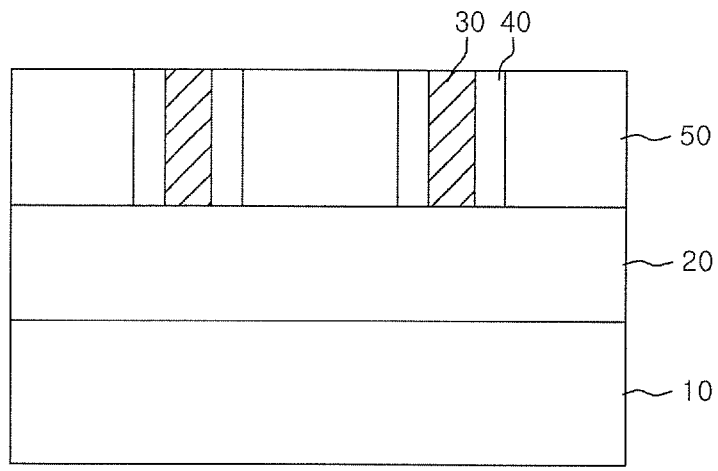

Referring to FIG. 3, an insulating layer 50 is formed on the base layer 20 to be buried between the hard mask patterns 30 of which the surface is oxidized. The insulating layer 50 is planarized to expose a surface of the remaining hard mask pattern 30.

Figure 4:
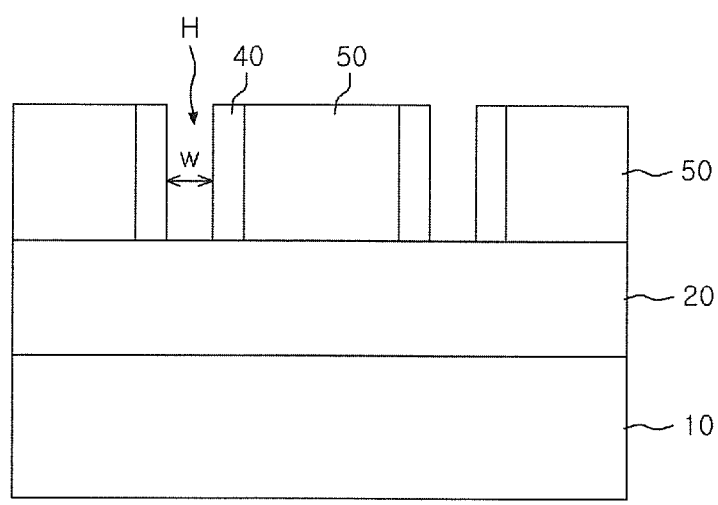

Referring to FIG. 4, the remaining hard mask pattern 30 is removed to form a fine contact hole H. The fine contact hole H has a narrower linewidth w than the linewidth W corresponding to the exposure limit by the oxidation process. Therefore, an interlayer insulating layer having the fine contact hole H is formed on the base layer 20.

FIGS. 5 to 10 are cross-sectional views for processes illustrating a method of manufacturing a phase-change memory device according to another exemplary embodiment. In the exemplary embodiment, a method of forming a heating electrode contact hole of the phase-change memory device is illustrated and described below.

Figure 5:
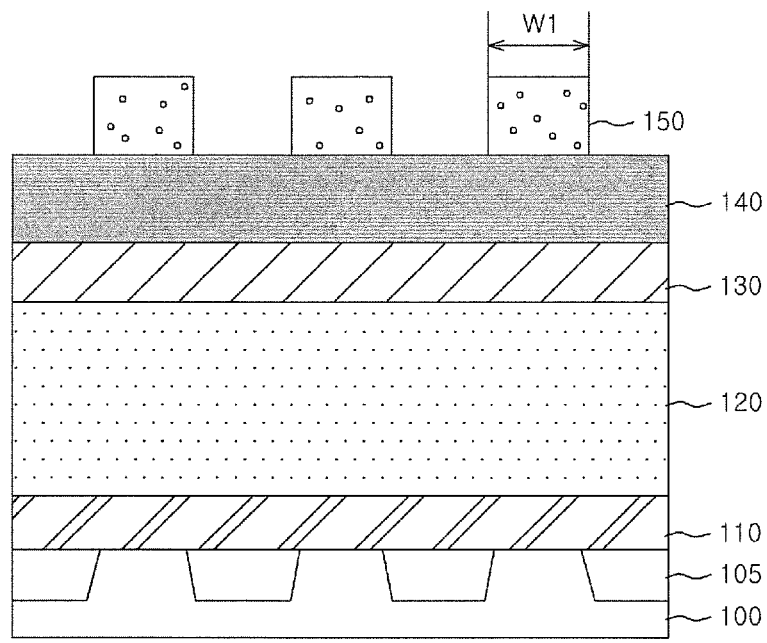
FIGS. 5 to 10 are cross-sectional views for processes illustrating a method of manufacturing a phase-change memory device according to another exemplary embodiment of the present invention.

Referring to FIG. 5, a metal layer 110, a switching device layer 120, an ohmic contact layer 130, and a hard mask layer 140 are sequentially stacked on a semiconductor substrate 100 in which an isolation layer 105 is formed. The metal layer 110 may be used, for example, as a metal word line of the phase-change memory device. Alternatively, the metal layer 110 may form a schottky diode with the switching device layer 120. The metal layer 110 may include a metal material having an oxidation-resistant property, for example, a titanium/titanium nitride (Ti/TiN) material. The switching device layer 120 forms a diode together with the metal layer 120 and may include, for example, a polysilicon layer. A certain type of impurity is implanted in the switching device layer 120 formed of the polysilicon layer corresponding to its depth to perform a diode operation. The ohmic contact layer 130 is provided for electric properties of the switching device layer 120 with a heating electrode to be formed later. The ohmic contact layer 130 may include a silicide layer. The hard mask layer 140 is formed to prevent scattered reflection due to the ohmic contact layer 130 and/or pattern deformation of a photoresist pattern to be formed later in a process of etching the photoresist pattern. In the exemplary embodiment, the hard mask layer 140 may include a silicon nitride layer. A photoresist pattern 150 is formed on the hard mask layer 140 using a photolithography process. The photoresist pattern 150 may have a linewidth W1 corresponding to an exposure limit and be positioned in a region in which a memory cell is to be formed.

Figure 6:
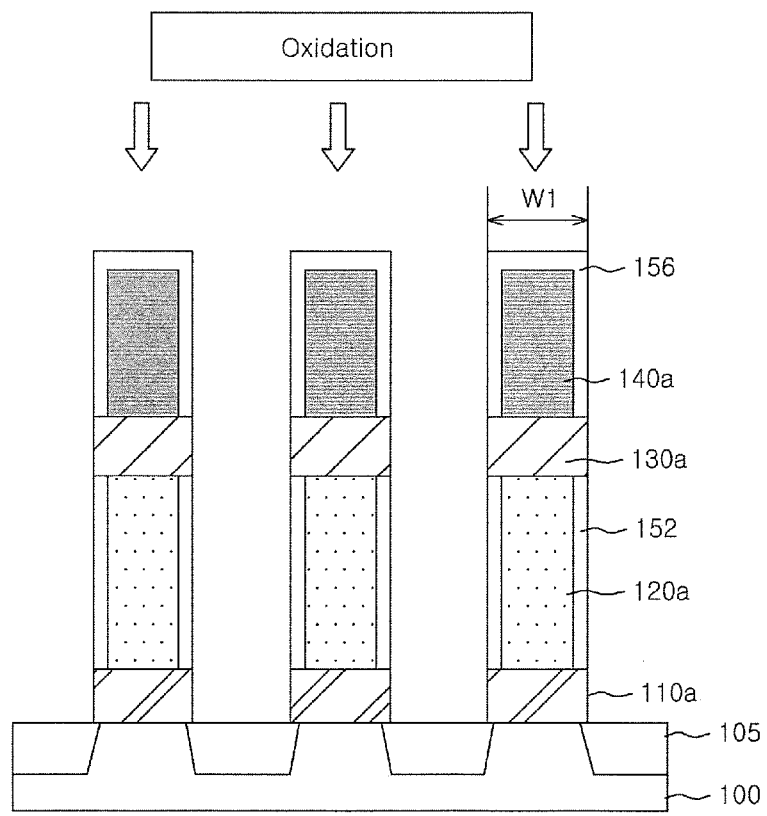

Referring to FIG. 6, the hard mask layer 140 is patterned in a shape of the photoresist pattern 150 to form a hard mask pattern 140a. Next, the photoresist pattern 150 is removed in a general removal process. The ohmic contact layer 130, the switching device layer 120, and the metal layer 110 are patterned in a shape of the hard mask pattern 140a to form an ohmic contact pattern 130a, a switching device pattern 120a, and a metal pattern 110a.

Subsequently, an oxidation process is performed on a resultant structure of the semiconductor substrate 100 to form an oxide layer 152 on a surface of the switching device pattern 120a and an oxide layer 156 on a surface of the hard mask pattern 140a. The oxidation process cures damage due to the patterning process and reduces a linewidth of a heating electrode to be formed later.

The oxidation process is performed under the condition that the polysilicon layer constituting the switching device pattern 120a and the hard mask pattern 140a are simultaneously oxidized. That is, the ohmic contact pattern 130a and the metal pattern 110a are not to be oxidized in the oxidation process. Therefore, the oxidation process may include a selective oxidation method. The oxidation process may include a plasma process to increase an oxidation efficiency. The oxidation process may be performed at a temperature of 200 to 500° C. to prevent impurities contained in the switching device pattern 120a from being diffused. In addition, the oxidation process may include a radical oxidation process using a radical ion to selectively oxidize the hard mask pattern 140a formed of a silicon nitride layer.

Thicknesses of the oxide layers 152 and 154 may be controlled by controlling an oxygen gas ($O_2$) flow, a hydrogen gas ($H_2$) flow, and a process pressure. For example, the oxidation process may be performed in ranges of the $O_2$ gas flow from 20 to 200 cc, the $H_2$ gas flow from 20 to 150 cc, and the process pressure from 0.03 to 3.0 Torr. The oxidation process may be performed to completely cure damage until the thicknesses of the oxide layers 152 and 156 become 30 to 100 Å. Here, the layer 152 obtained by oxidizing the switching device pattern 120a may be a silicon oxide ($SiO_2$) layer and the layer 156 obtained by oxidizing the hard mask pattern 140a may be a silicon oxynitride (SiON) layer.

Figure 7:
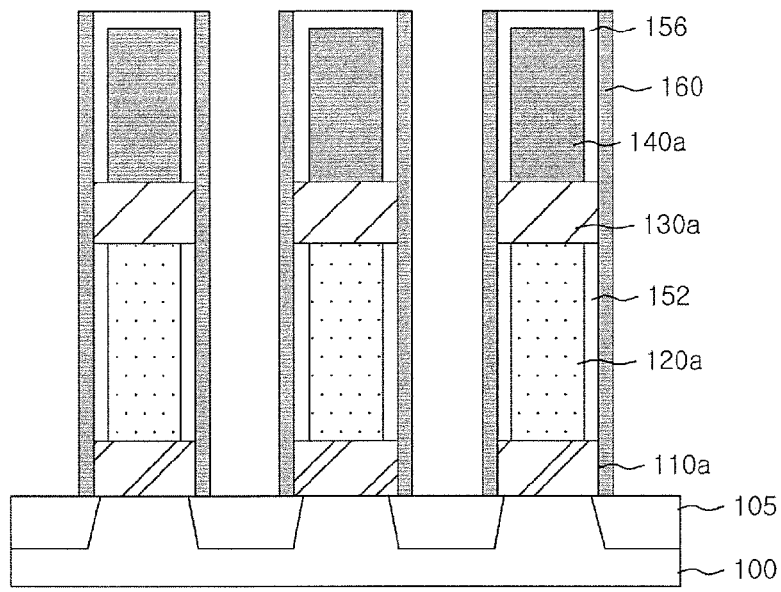
Figure 12:
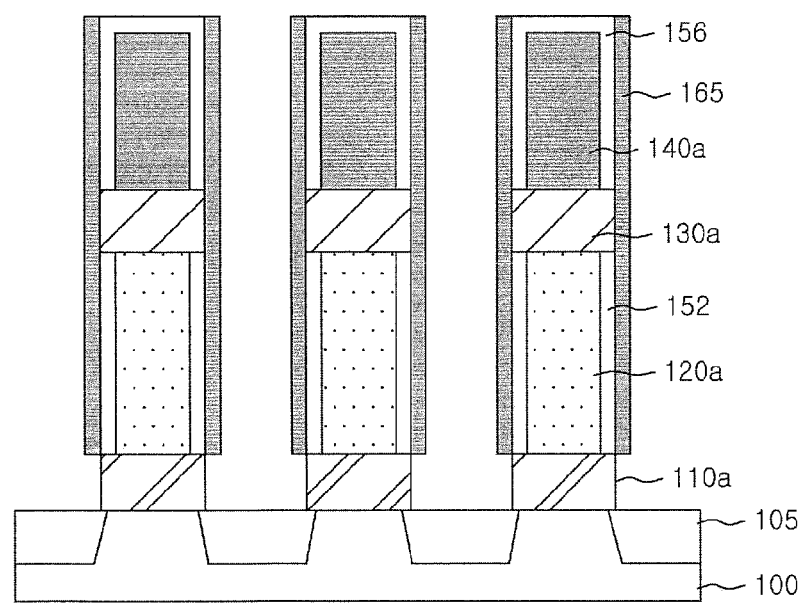

Referring to FIG. 7, a spacer 160 is formed on sidewalls of the metal pattern 110a, the surface-oxidized switching device pattern 120a, the ohmic contact pattern 130a, and the surface-oxidized hard mask pattern 140a. The spacer 160 may be formed by depositing an insulating layer for a spacer on a resultant structure of the semiconductor substrate 100 and anisotropically etching the insulating layer for a spacer to expose the surfaces of the hard mask pattern 140a and the semiconductor substrate 100. For the anisotropic etching process, the spacer 160 may include, for example, an insulating layer having an oxidation-resistant property such as a silicon nitride layer. The spacer 160 serves to protect a resultant structure of the semiconductor substrate in a subsequent process. In some cases, the process of forming the spacer 160 may be omitted. As shown in FIG. 12, a spacer 165 may be formed only on sidewalls of a hard mask pattern 140a, an ohmic contact pattern 130a, and the switching device pattern 120a.

Figure 8:
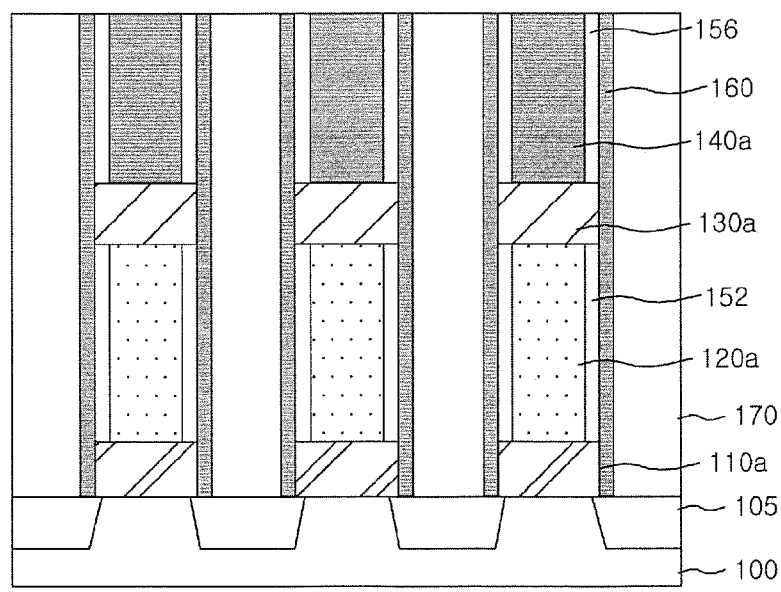

Referring to FIG. 8, an interlayer insulating layer 170 is formed to be buried between the resultant structures each of which is covered by the spacer 160. The interlayer insulating layer 170 may include, for example, a silicon oxynitride material. The interlayer insulating layer 170 is planarized to expose the surface of the hard mask pattern 140a, thereby filling the space between the resultant structures. The oxide layer 156 on an upper surface of the hard mask pattern 140a may be removed in the planarization process.

Figure 9:
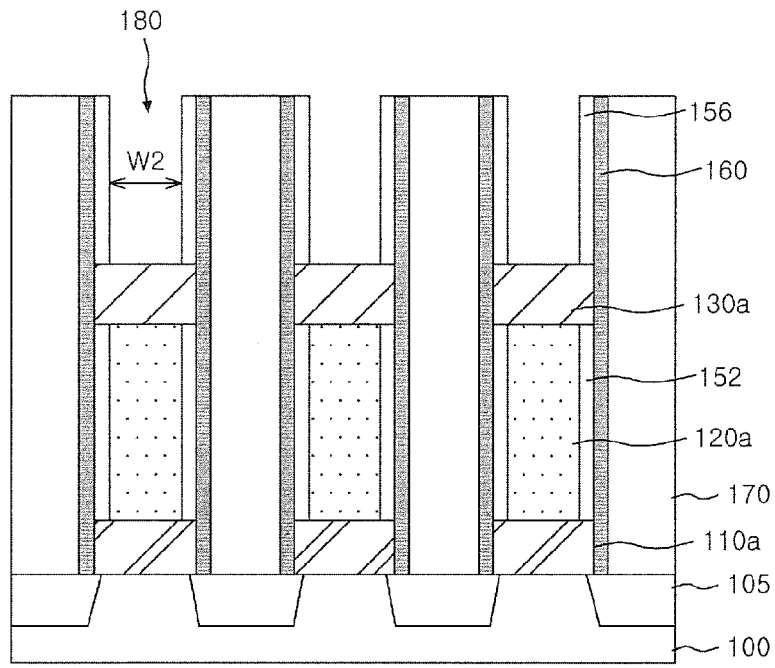

Referring to FIG. 9, the exposed hard mask pattern 140a is removed. When the hard mask pattern 140a is formed of a silicon nitride layer, the hard mask pattern 140a is selectively removed by a dipping process using a phosphoric acid solution ($H_3PO_4$). Thus, a contact hole 180 is formed in a region from which the hard mask pattern 140a is removed. The contact hole 180 has a linewidth W2 smaller than the linewidth W1 of the photoresist pattern 150 corresponding to the exposure limit. At this time, the linewidth W2 of the contact hole 180 may has a value obtained by subtracting twice times the thickness of the oxide layer 156 from the linewidth W1 of the photoresist pattern 150. Therefore, the contact hole 180 having the linewidth W2 less than a value determined by the exposure limit may be formed.

In addition, since the contact 180 is formed by selectively removing the hard mask pattern 140a through a wet etching process, a not-open error is not caused. Since a process of forming a spacer is not performed on a sidewall of the contact hole 180, loss of an upper sidewall of the contact hole and a sidewall damage of the metal pattern 110a are not caused.

Figure 10:
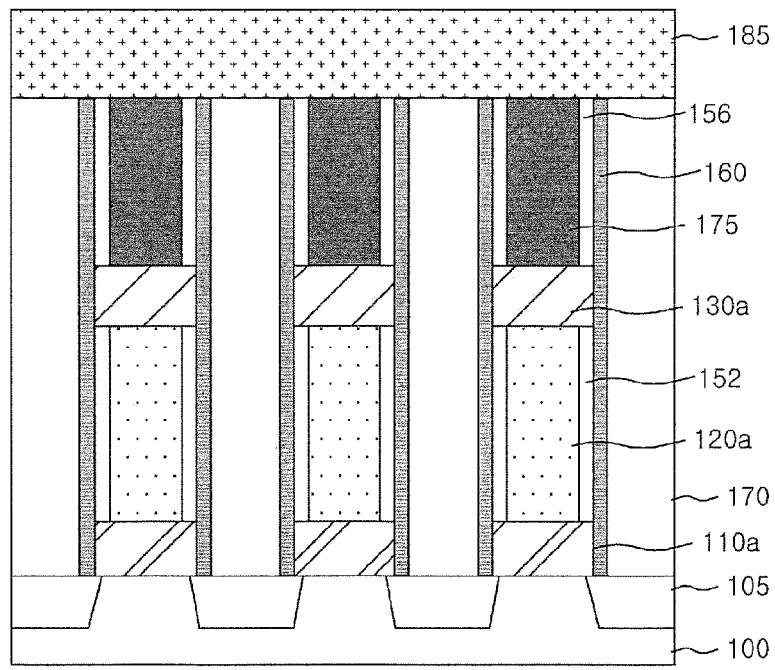

As shown in FIG. 10, a heating electrode 175 is formed to be buried within the contact hole 180 and a phase-change material layer 185 is formed on a resultant structure to be connected to the heating electrode 175.

Figure 11:
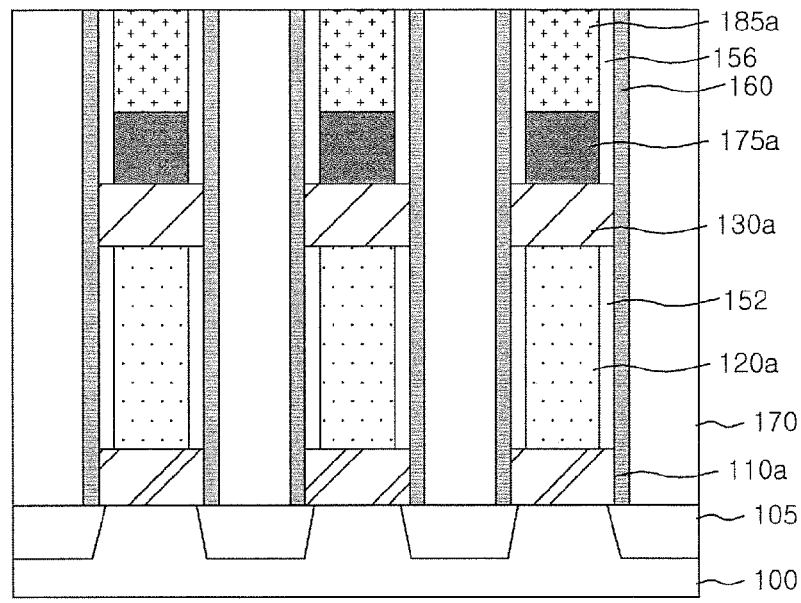
FIGS. 11 and 12 are cross-sectional views illustrating a method of manufacturing a phase-change memory device according to still another exemplary embodiment of the present invention.

As shown in FIG. 11, a heating electrode 175a may be formed only in a lower portion of a contact hole 180. The heating electrode 175a remains only in the lower region of the contact hole 180 by burying a conductive material within the contact hole 180 and overetching the conductive material. Next, a phase-change material layer 185a is buried within the contact hole 180 on the heating electrode 175a, thereby fabricating a confined type phase-change memory device.

As described above, a space formed by oxidizing a surface of the hard mask pattern and removing the unoxidized hard mask pattern is used as the contact hole. Therefore, opening error due to an etching process using a lithography process may be prevented from occurring and thus off current characteristics of the device may be enhanced.

In addition, the contact hole may be formed to have a linewidth over the exposure limit. In particular, when the contact hole is applied to the phase-change memory device, a linewidth of the heating electrode may be reduced and thus reset current characteristics may be enhanced.

While certain embodiments have been described above, it will be understood that the embodiments described are by way of example only. Accordingly, the present invention should not be limited to the specific disclosed embodiments, and claims should be broadly interpreted to include all reasonably suitable embodiments consistent with the exemplary embodiments.

What is claimed is:

1. A method of manufacturing a phase-change memory device, comprising:
    forming a switching device layer, an ohmic contact layer, and a hard mask layer on a semiconductor substrate;
    patterning the hard mask layer to form a hard mask pattern;
    etching the ohmic contact layer and the switching device layer using the hard mask pattern to form a pattern structure including an ohmic contact pattern, a switching device pattern, and the hard mask pattern;
    selectively oxidizing a surface of the pattern structure;
    forming an insulating layer to bury the pattern structure; and
    selectively removing the hard mask pattern other than the oxidized surface thereof to form a contact hole.

2. The method of claim 1, wherein the selective oxidizing of the surface of the pattern structure includes selectively oxidizing surfaces of the hard mask pattern and the switching device pattern.

3. The method of claim 2, wherein the hard mask pattern includes a silicon nitride layer and the switching device pattern includes a polysilicon layer containing impurities.

4. The method of claim 3, wherein the selective oxidizing of the surface of the pattern structure includes performing a radical oxidation method using a radical ion.

5. The method of claim 3, wherein the selective oxidizing of the surface of the pattern structure includes performing an oxidation process by applying plasma.

6. The method of claim 1, wherein the selective oxidizing of the surface of the pattern structure is performed at ranges of an oxygen gas ($O_2$) flow between 20 and 200 cc, a hydrogen gas ($H_2$) flow between 20 and 150 cc, and a process pressure between 0.03 and 3.0 Torr.

7. The method of claim 1, wherein a thickness of the oxidized surface of the hard mask pattern is 30 to 100 Å.

8. The method of claim 1, further comprising forming a spacer on a sidewall of the pattern structure after the selective oxidizing of the surface of the pattern structure.

9. The method of claim 8, wherein the forming of the spacer includes forming a silicon nitride layer.

10. The method of claim 1, further, after the forming of the contact hole, comprising:
    forming a heating electrode within the contact hole; and
    forming a phase-change material layer on the insulating layer to be in contact with the heating electrode.

11. The method of claim 1, further, after the forming of the contact hole, comprising:
    forming a heating electrode in a lower region of the contact hole; and
    burying a phase-change material layer within the contact hole on the heating electrode.

12. The method of claim 1, further, before the forming of the switching device layer, the ohmic contact layer, and the hard mask layer, comprising forming a word line on the semiconductor substrate.

13. A method of manufacturing a phase-change memory device, comprising:
    forming a pattern structure on a semiconductor substrate, wherein the pattern structure includes a metal pattern, a switching device pattern, an ohmic contact pattern, and a hard mask pattern;
    selectively oxidizing the hard mask pattern by a set thickness;
    forming a spacer on a sidewall of the pattern structure;
    forming and planarizing an insulating layer to bury the pattern structure;
    selectively removing the hard mask pattern other than the oxidized portion thereof to form a contact hole;
    forming a heating electrode within the contact hole; and
    forming a phase-change material layer to be electrically connected to the heating electrode.

14. The method of claim 13, wherein the selective oxidizing of the hard mask pattern includes selectively oxidizing surfaces of the switching device pattern and the hard mask pattern simultaneously.

15. The method of claim 13, wherein the hard mask pattern includes a silicon nitride layer.

16. The method of claim 13, wherein the selective oxidizing of the hard mask pattern is performed at ranges of an oxygen gas ($O_2$) flow between 20 and 200 cc, a hydrogen gas ($H_2$) flow between 20 and 150 cc, and a process pressure between 0.03 and 3.0 Torr.

17. The method of claim 13, wherein the set thickness of the oxidized hard mask pattern is 30 to 100 Å.

18. The method of claim 13, wherein the forming of the spacer includes forming a silicon nitride layer.

19. A method of manufacturing a semiconductor device, comprising:

forming a base layer on a semiconductor substrate;

forming silicon nitride layer patterns having a linewidth determined by an exposure limit on the base layer;

oxidizing a surface of each of the silicon nitride layer patterns to form a silicon oxynitride layer having a set thickness on a surface of each of oxidized silicon nitride layer patterns;

filling an insulating layer between the oxidized silicon nitride layer patterns and planarizing the insulating layer to expose an upper surface of the oxidized silicon nitride layer pattern; and removing each of the oxidized silicon nitride layer patterns to form a contact hole.

20. The method of claim 19, wherein the removing of each of the oxidized silicon nitride layer patterns includes dipping the oxidized silicon nitride layer patterns in a phosphoric acid solution.

* * * * *